(12) United States Patent
Kroes et al.

(10) Patent No.: US 10,095,130 B2
(45) Date of Patent: Oct. 9, 2018

(54) LITHOGRAPHIC APPARATUS AND METHOD IN A LITHOGRAPHIC PROCESS

(71) Applicant: ASML NETHERLANDS B.V., Veldhoven (NL)

(72) Inventors: Johannes Pieter Kroes, Eindhoven (NL); Kevin Nicolas Stephan Couteau, Eindhoven (NL); Rachid El Boubsi, The Hague (NL); Rob Johan Theodoor Rutten, Heeze (NL); Patrick Johannes Cornelus Hendrik Smulders, Boxtel (NL); Martijn Lambertus Peter Visser, Roermond (NL); Jan Steven Christiaan Westerlaken, Heesch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/567,252

(22) PCT Filed: Mar. 9, 2016

(86) PCT No.: PCT/EP2016/054951
§ 371 (c)(1),
(2) Date: Oct. 17, 2017

(87) PCT Pub. No.: WO2016/169692
PCT Pub. Date: Oct. 27, 2016

(65) Prior Publication Data
US 2018/0113389 A1    Apr. 26, 2018

(30) Foreign Application Priority Data

Apr. 20, 2015  (EP) .................................... 15164217

(51) Int. Cl.
*G03B 27/52*  (2006.01)
*G03F 7/20*   (2006.01)

(52) U.S. Cl.
CPC ...... *G03F 7/70908* (2013.01); *G03F 7/70716* (2013.01)

(58) Field of Classification Search
CPC ............. G03F 7/70341; G03F 7/70908; G03F 7/70716; G03F 7/70858
(Continued)

(56) References Cited

U.S. PATENT DOCUMENTS

| 5,141,318 | A  | 8/1992 | Miyazaki et al. |
| 7,253,875 | B1 | 8/2007 | Luttikhuis et al. |

(Continued)

FOREIGN PATENT DOCUMENTS

| EP | 2423749      | 2/2012 |
| WO | 2014/005780  | 1/2014 |

OTHER PUBLICATIONS

International Search Report for corresponding International Patent Application No. PCT/EP2016/054951 dated Jun. 22, 2016.

(Continued)

*Primary Examiner* — Hung Henry Nguyen
(74) *Attorney, Agent, or Firm* — Pillsbury Winthrop Shaw Pittman, LLP

(57) ABSTRACT

An apparatus has a first component with a first surface and a second component with a second surface, wherein the first and second components can undergo relative movement. The first surface and the second surface face each other. The first surface accommodates a barrier system to provide a barrier to reduce or prevent an inflow of ambient gas into a protected volume of gas between the first and second surfaces. The barrier system includes a curtain opening adapted for a flow of curtain gas therefrom for establishing a gas curtain enclosing part of the protected volume, and an inner entrainment opening, located inward of the curtain opening with respect to the protected volume, adapted for a (Continued)

flow of inner entrainment gas therefrom for being entrained into the flow of curtain gas. The apparatus is configured such that the inner entrainment gas flow is less turbulent than the curtain gas flow.

20 Claims, 3 Drawing Sheets

(58) Field of Classification Search
USPC .................................................... 355/30, 53
See application file for complete search history.

(56) References Cited

U.S. PATENT DOCUMENTS

| | | | |
|---|---|---|---|
| 8,988,650 B2* | 3/2015 | Westerlaken | ....... G03F 7/70341 355/30 |
| 9,939,740 B2* | 4/2018 | Nakiboglu | .......... G03F 7/70858 |
| 2001/0038442 A1 | 11/2001 | Hansell et al. | |
| 2006/0119811 A1 | 6/2006 | Simon | |
| 2011/0199601 A1 | 8/2011 | Kaneko et al. | |
| 2012/0052447 A1 | 3/2012 | Westerlaken et al. | |
| 2015/0168854 A1 | 6/2015 | Westerlaken et al. | |

OTHER PUBLICATIONS

Written Opinion of the International Searching Authority for corresponding International Patent Application No. PCT/EP2016/054951 dated Jun. 22, 2016.

\* cited by examiner

LITHOGRAPHIC APPARATUS AND METHOD IN A LITHOGRAPHIC PROCESS

CROSS-REFERENCE TO RELATED APPLICATIONS

This application is the U.S. national phase entry of PCT patent application no. PCT/EP2016/054951, which was filed on Mar. 9, 2016, which claims the benefit of priority of European patent application no. 15164217.0, which was filed on Apr. 20, 2015, and which is incorporated herein in its entirety by reference.

FIELD

The present invention relates to a lithographic apparatus and a method in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers. In steppers each target portion is irradiated by exposing an entire pattern onto the target portion at one time. Another known lithographic apparatus include so-called scanners. In scanners each target portion is irradiated by scanning the pattern through a projection radiation beam in a given direction (the "scanning"-direction) while synchronously scanning the substrate parallel or anti-parallel to this given direction. It is also possible to transfer the pattern from the patterning device to the substrate by imprinting the pattern onto the substrate.

A lithographic apparatus makes measurements before starting and/or during transfer of the pattern onto the substrate. An example measurement is the position of the substrate relative to a reference frame or a projection system through which the pattern is projected. Measurements can be made using a measurement radiation beam.

The rate at which the lithographic apparatus applies the desired pattern on the substrate, known as throughput, is a major performance criteria in lithography apparatus. A faster throughput is desirable. Throughput is dependent on multiple factors. One factor on which throughput is dependent is the speed at which transfer of the pattern onto the substrate takes place. Another factor on which throughput is dependent is the speed at which measurements needed prior to transfer of the pattern can be taken. Therefore, it is beneficial to have high moving speeds of the substrate during transfer of the pattern onto the substrate and during measurement. However, it is important to maintain accuracy of measurements and transfer of the pattern at the high moving speeds.

Measurement radiation beams in the lithographic apparatus pass through gas, referred to as ambient gas. Local fluctuations in the characteristics of an ambient gas can affect a measurement radiation beam passing through it. Projection radiation beams can be affected in the same way as measurement radiation beams. Therefore, it is an aim of the present invention to provide an apparatus with reduced fluctuations in the characteristics of an ambient gas at a location through which a measurement radiation beam and/ or a projection radiation beam passes.

SUMMARY OF THE INVENTION

According to an aspect of the invention, there is provided a lithographic apparatus comprising a first component and a second component that are configured to undergo relative movement with respect to one another, wherein: the first component has a first surface; the second component has a second surface, the first surface and the second surface facing each other; the first surface accommodates a barrier system configured to provide a barrier operative to reduce or prevent an inflow of ambient gas into a protected volume of gas between the first surface and the second surface, the barrier system comprising: at least one curtain opening adapted for a flow of curtain gas therefrom for establishing a gas curtain enclosing part of the protected volume adjacent the first surface; and at least one inner entrainment opening adapted for a flow of inner entrainment gas therefrom for being entrained into the flow of curtain gas; wherein the lithographic apparatus is configured such that the flow of inner entrainment gas is less turbulent than the flow of curtain gas; and the at least one inner entrainment opening is radially inward of the at least one curtain opening with respect to the protected volume.

According to an aspect of the invention, there is provided a method in a lithographic process comprising: performing relative movement of a first component with respect to a second component, wherein the first component has a first surface, the second component has a second surface and the first surface and the second surface face each other; and providing a barrier operative to reduce or prevent an inflow of ambient gas into a protected volume of gas between the first surface and the second surface, wherein providing the barrier comprises: providing a flow of curtain gas from at least one curtain opening accommodated by the first surface so as to establish a gas curtain enclosing part of the protected volume adjacent the first surface; and providing a flow of inner entrainment gas from at least one inner entrainment opening accommodated by the first surface for being entrained into the flow of curtain gas, wherein the flow of inner entrainment gas is less turbulent than the flow of curtain gas; wherein the at least one inner entrainment opening is radially inward of the at least one curtain opening with respect to the protected volume.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
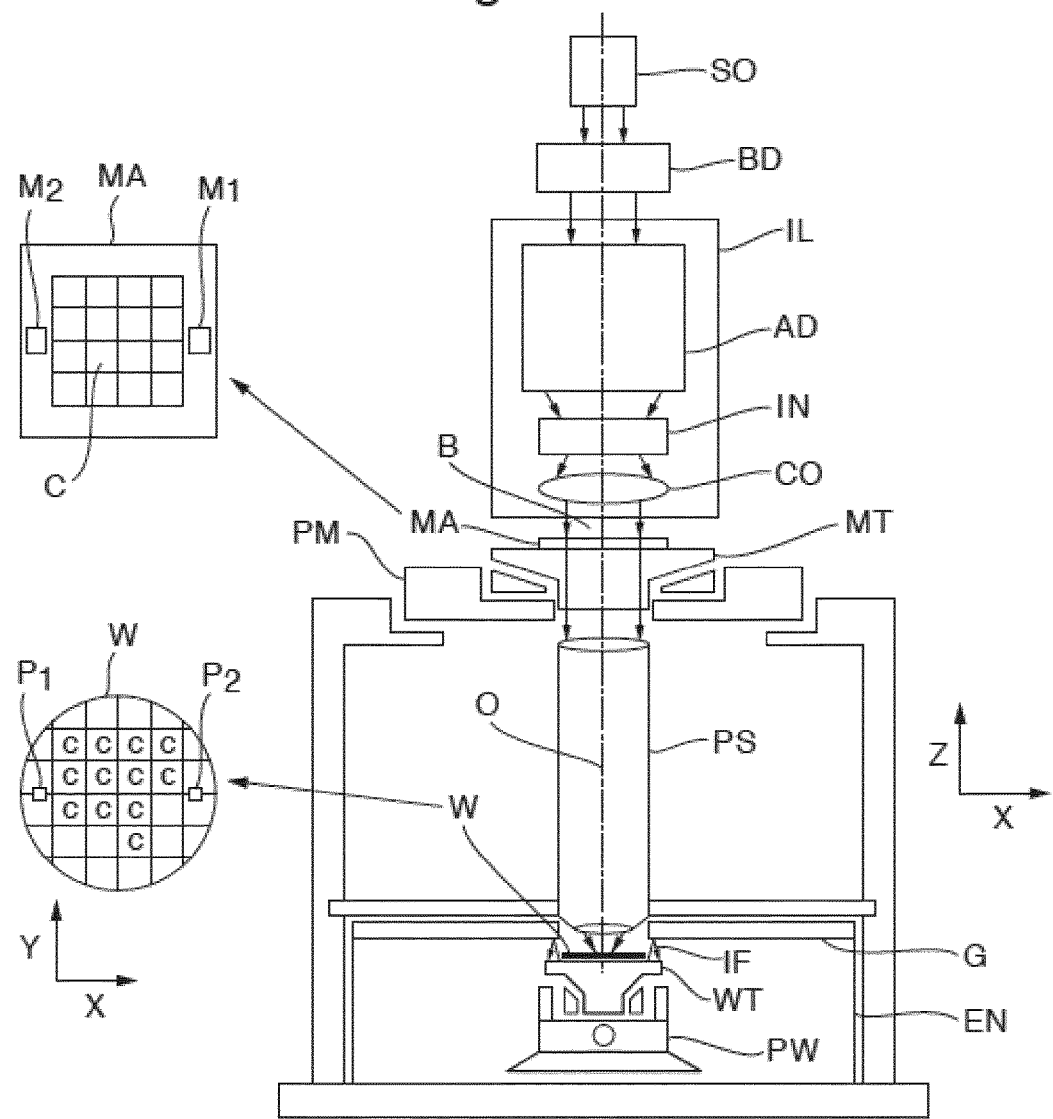
FIG. 1 depicts a lithographic apparatus according to an embodiment of the present invention.

FIG. 1 schematically depicts a lithographic apparatus according to one embodiment of the invention. The apparatus comprises:

- an illumination system (illuminator) IL configured to condition a radiation beam B (e.g. UV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the projection radiation beam B by patterning device MA onto a target portion C (e.g. comprising one or more dies) of the substrate W.

The lithographic apparatus comprises an enclosure EN. The enclosure EN encloses at least the substrate table WT. An ambient gas is present in the enclosure EN.

The illumination system IL may include various types of optical components, such as refractive components, reflective components, magnetic components, electromagnetic components, electrostatic components or other types of optical components, or any combination thereof, for directing radiation, shaping radiation, or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a projection radiation beam with a pattern in its cross-section such as to create a pattern in a target portion C of the substrate W. It should be noted that the pattern imparted to the projection radiation beam may not exactly correspond to the desired pattern in the target portion C of the substrate W, for example if the pattern includes phase-shifting features or so called assist features. Generally, the pattern imparted to the projection radiation beam will correspond to a particular functional layer in a device being created in the target portion C, such as an integrated circuit.

The lithographic apparatus may be of a type having two (dual stage) or more substrate tables WT (and/or two or more mask tables MT). In such "multiple stage" machines the additional substrate table(s) WT and/or mask table(s) MT may be used in parallel. Alternatively preparatory steps may be carried out on one or more substrate table(s) WT and/or mask table(s) MT while one or more other substrate table(s) WT and/or mask table(s) MT are being used for transfer of the pattern onto the substrate W.

The lithographic apparatus may also be of a type wherein at least a portion of the substrate W may be covered by an immersion liquid having a relatively high refractive index, e.g. water, so as to fill a space between the projection system PS and the substrate W. Immersion techniques are well known in the art for increasing the numerical aperture of projection system PS. The term "immersion" as used herein does not mean that a structure, such as a substrate, must be submerged in immersion liquid, but rather only means that immersion liquid is located between the projection system PS and the substrate W during transfer of the pattern onto the substrate.

The projection radiation beam B is incident on the patterning device (e.g., mask MA), which is held on the support structure (e.g., mask table MT), and is patterned by the patterning device. Having traversed the mask MA, the projection radiation beam B passes through the projection system PS, which focuses the projection radiation beam onto a target portion C of the substrate W. With the aid of the second positioner PW and position sensor IF (e.g. an interferometric device, linear encoder with grid G as illustrated in FIG. 1 or capacitive sensor), the substrate table WT can be moved accurately, e.g. so as to position different target portions C in the path of the projection radiation beam B. Similarly, the first positioner PM and another position sensor (which is not explicitly depicted in FIG. 1) can be used to accurately position the mask MA with respect to the path of the projection radiation beam B, e.g. after mechanical retrieval from a mask library, or during a scan in a scanner. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1, P2 as illustrated occupy dedicated target portions C, they may be located in spaces between target portions C (these are known as scribe-lane alignment marks). Similarly, in situations in which more than one die is provided on the mask MA, the mask alignment marks M1, M2 may be located between the dies.

The depicted lithographic apparatus could be used in a scanning mode, i.e. as a scanner. In the scanning mode, the mask table MT and the substrate table WT are scanned synchronously while a pattern imparted to the projection radiation beam B is projected onto a target portion C (i.e. a single dynamic exposure). The velocity and direction of the substrate table WT relative to the mask table MT may be determined by the (de-)magnification and image reversal characteristics of the projection system PS.

In the scanning mode, the substrate table WT can move along in a meander path or move back and forwards in the scanning direction SC. Scanning can occur when the substrate table WT is moving forward or backwards along the scanning direction SC. Both directions of movement are equivalent. Purely for ease of description, one direction is referred to as the forward scanning direction and the other as the backward scanning direction.

The substrate table WT (and/or the mask table MT) may be moved in a stepping direction to expose a different target portion C of the substrate W. The stepping direction is substantially perpendicular to the scanning direction SC.

The scanning direction SC and the stepping direction can be referred to as the X and Y directions respectively, and vice versa.

A lithographic apparatus uses measurement radiation beams. Measurement radiation beams are used to measure the position, or properties of, different components of the lithographic apparatus. A lithographic apparatus uses a projection radiation beam B to image the substrate W. The projection radiation beam B and measurement radiation beam are affected by ambient gases through which the respective projection radiation beam B and measurement radiation beam pass.

Several factors can affect how a measurement radiation beam propagates through a gas. For example, temperature of the gas, humidity of the gas and composition of the gas are factors which may affect the refractive index of a gas. Localised variations of these factors and turbulence in the gas can result in non-uniformities in the refractive index of the gas. A measurement radiation beam passing through a gas is affected by variations in the refractive index. For example, a change in the refractive index can alter the trajectory of the measurement radiation beam. Additionally or alternatively a change in the refractive index can introduce wavefront errors into the measurement radiation beam. Measurement errors can be induced by variations in the refractive index along a path of a measurement radiation beam. Measurement errors can lead to positioning inaccuracies in the positioning of components of the lithograph apparatus. Any such positioning inaccuracies can alter the placement of the patterned radiation beam B on the substrate W and so can have a detrimental effect on overlay.

Figure 4:
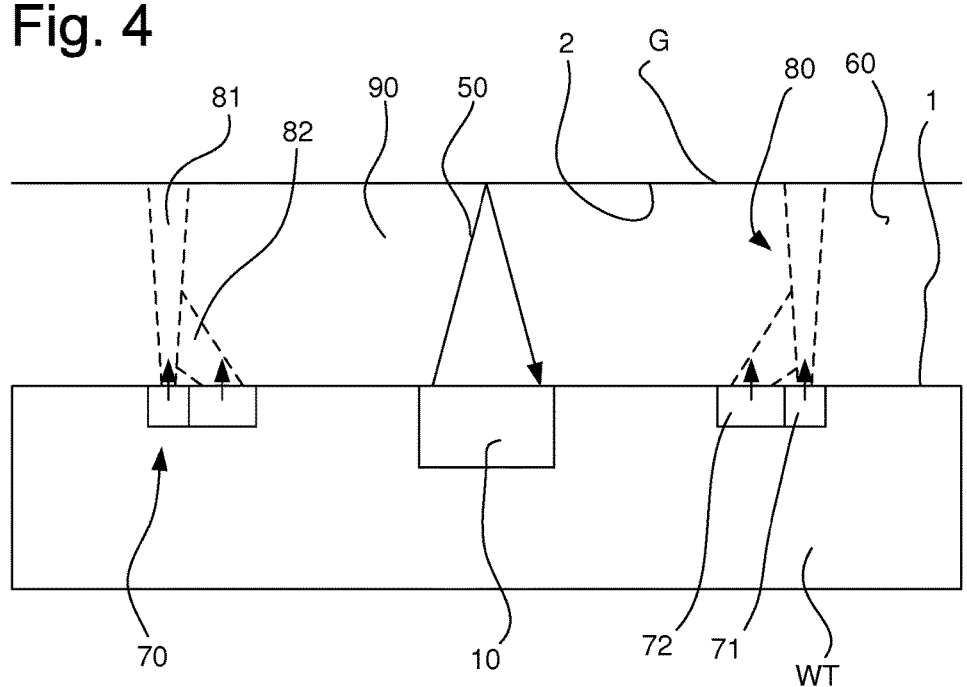
FIGS. 4 and 5 illustrate, in cross-section, different embodiments of a substrate table according to an embodiment of the present invention.
Figure 5:
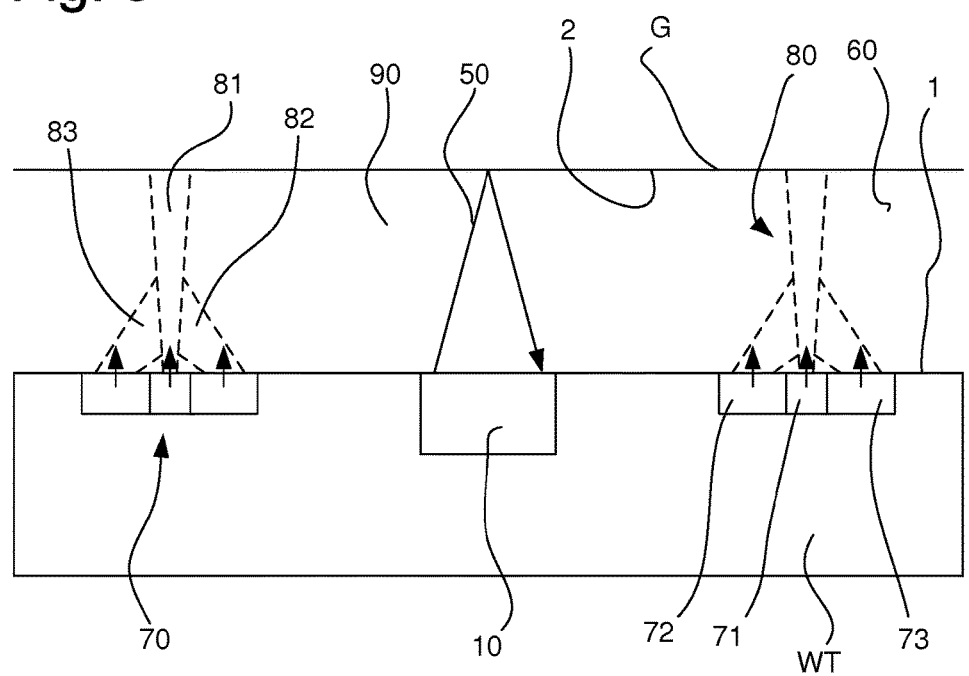

As depicted in FIG. 4 and FIG. 5, in an embodiment a barrier system 70 is provided to try to reduce the fluctuations in the refractive index of an ambient gas through which a measurement radiation beam passes. The barrier system 70 is configured to provide a barrier 80 operative to reduce an inflow of ambient gas into a protected volume 90 between a first surface 1 and a second surface 2. Measurement radiation beams can pass through the protected volume 90 between the first surface 1 and the second surface 2. Therefore, gas in the protected volume 90 through which a measurement radiation beam passes can be controlled.

In an embodiment the barrier system 70 establishes a gas curtain 81 which is provided by ejecting barrier gas from at least one curtain opening 71 in the first surface 1. The gas curtain 81 forms part of a barrier 80 which impedes the flow of ambient gas on one side of the gas curtain 81. The gas curtain 81 can be provided around the protected volume 90 such that the gas within the protected volume 90 is effectively separated from the ambient gas outside the protected volume 90. The gas within the protected volume 90 can be conditioned such that it is more uniform than the gas outside of the protected volume 90. Therefore, the gas curtain 81 can be used to provide a barrier 80 around the protected volume 90 through which a measurement radiation beam passes. This protects the measurement radiation beam from the effects of changes in ambient gas outside the protected volume 90. The gas within the protected volume 90 is referred to as the protected gas.

Any unconditioned ambient gas which enters into the protected volume 90 can affect the propagation of the measurement radiation beam and induce errors. Various different ways of preventing ambient gas from entering the protected volume 90 using the gas curtain 81 are possible. The different ways include, but are not limited to (i) providing a jet of gas through a single set of curtain openings 71 in the first surface 1 and (ii) providing a turbulent flow of gas through a first set of curtain openings 71 in the first surface 1 surrounding the protected volume 90 radially inwardly with respect to the protected volume 90 of a flow of outer entrainment gas 83 provided through a set of outer entrainment openings 73 in the first surface 1.

However, wind tunnel tests have shown that as moving speed increases, more and more unconditioned ambient gas enters into the protected volume 90 and contaminates the protected gas.

In an embodiment, a lithographic apparatus is provided comprising a first component which is accommodated in the enclosure EN. The lithographic apparatus is configured to cause the first component to undergo movement relative to the enclosure EN, in a predetermined direction and in a plane perpendicular to an optical axis O of the projection system PS. In an embodiment the lithographic apparatus is configured to let the first component maintain a predetermined orientation with respect to the enclosure EN during the movement relative to the enclosure EN. Movement of the first component in the enclosure EN induces a flow of the ambient gas in the enclosure EN relative to the first component. The first component has a first surface 1 oriented perpendicularly to the optical axis O.

During relative movement of the first component (such as a substrate table WT) in the ambient gas of the enclosure EN, the flow of the ambient gas relative to the first component is induced.

The first surface 1 of the first component accommodates a barrier system 70. The barrier system 70 is configured to provide a barrier 80. The barrier 80 is operative to reduce or prevent an inflow of ambient gas into the protected volume 90 of gas. The protected volume 90 of gas is between the first surface 1 and the second surface 2 of the second component. In an embodiment the first component comprises a measurement sensor 10 configured to make measurements using a radiation beam 50.

In an embodiment the barrier system 70 comprises at least one curtain opening 71. The at least one curtain opening 71 is adapted for a flow of curtain gas. The flow of curtain gas is for establishing a gas curtain 81. The gas curtain 81 encloses part of the protected volume 90 adjacent the first surface 1. In an embodiment the flow of curtain gas from the at least one curtain opening 71 is a turbulent jet. A turbulent jet inherently entrains gas from its surroundings, mainly at the foot (i.e. adjacently at least one curtain opening 71).

Inside the protected volume 90, the suction of the flow of curtain gas can set up an internal circulation of gas. The flow of curtain gas can cause a vortex inside the protected volume 90. The vortex can include turbulent eddies from the flow of curtain gas. The vortex can cause velocity and pressure variations in the protected gas in the protected volume 90. The velocity and pressure variations can cause variations in the refractive index of the gas in the protected volume. The variations of the refractive index can disturb the optical beam path. This can cause an error in the measurements made by the measurement sensor 10. This type of error can be called pressure noise. The error can adversely affect overlay and/or focus performance.

The present invention aims to increase the stability of the protected gas in the protected volume 90. In an embodiment the barrier system 70 comprises at least one inner entrainment opening 72. The at least one inner entrainment opening 72 is adapted for a flow of inner entrainment gas 82 therefrom. The flow of inner entrainment gas 82 is for being entrained into the flow of curtain gas that establishes the gas curtain 81. The at least one inner entrainment opening 72 is radially inward of the at least one curtain opening 71 with respect to the protected volume 90. The lithographic apparatus is configured such that the flow of inner entrainment gas 82 is less turbulent than the flow of curtain gas.

In an embodiment the flow of inner entrainment gas 82 is substantially laminar. The flow of inner entrainment gas 82 can suppress internal circulation of gas within the protected volume 90. Suppression of the internal circulation can result in a more stable environment within the protected volume 90. The environment within the protected volume 90 may be more stable in terms of pressure and velocity variations.

Additionally or alternatively, the flow of inner entrainment gas 82 can flush the protected volume 90 from inside. Flushing the protected volume 90 from inside the protected volume 90 can create a protection buffer between the gas curtain 81 and the measurement radiation beam 50. The protection buffer may be substantially laminar.

An embodiment of the invention is expected to achieve a reduction in the noise level caused by pressure and velocity variations throughout the protected gas within the protected volume 90.

An embodiment of the invention is expected to achieve a reduction in the recovery time to restore the protected volume 90 after relative movement between the first component and the second component. After a fast move during which the protected volume 90 is disrupted, a recovery time is required to restore the stability of the protected gas within the protected volume 90. The flow of inner entrainment gas 72 can significantly reduce the recovery time. This is because the flow of inner entrainment gas 72 can refresh the protected gas within the protected volume 90 from inside the protected volume 90.

The invention is described below with reference to a system in which the first surface 1 configured to direct the flow of ambient gas is a surface associated with a gas curtain and the first component is a substrate table WT. However, the invention is not limited to such a system and can be applied to other systems. The following description will focus on measurement radiation beams. However, the principles apply equally to projection radiation beams. For example, movement of the mask table MT can induce a flow of ambient gas over a surface of the mask MA. A flow of ambient gas over the surface of the mask MA can lead to variations in refractive index. The projection radiation beam passing through the gas affected by variations in refractive index can lead to changes in the projection radiation beam. Changes in the projection radiation beam can lead to imaging errors. So the principles described below in relation to reducing gas flow over the first surface 1 can be used elsewhere in a lithographic apparatus, such as on a mask table MT.

In an embodiment, the first component comprises a substrate table WT. In an embodiment a second component comprises the grid G. Grid G is mounted in a known relative position to the projection system PS. The first component and the second component are configured to undergo relative movement with respect to one another. The relative movement between the first component and the second component is in at least one of the scanning direction SC and the stepping direction within the enclosure EN. The first component or the second component may remain stationary whilst the other of the first component and second component moves relative to it. The first component and second component may also move relative to each other in directions other than the scanning direction SC and stepping direction.

Figure 2:
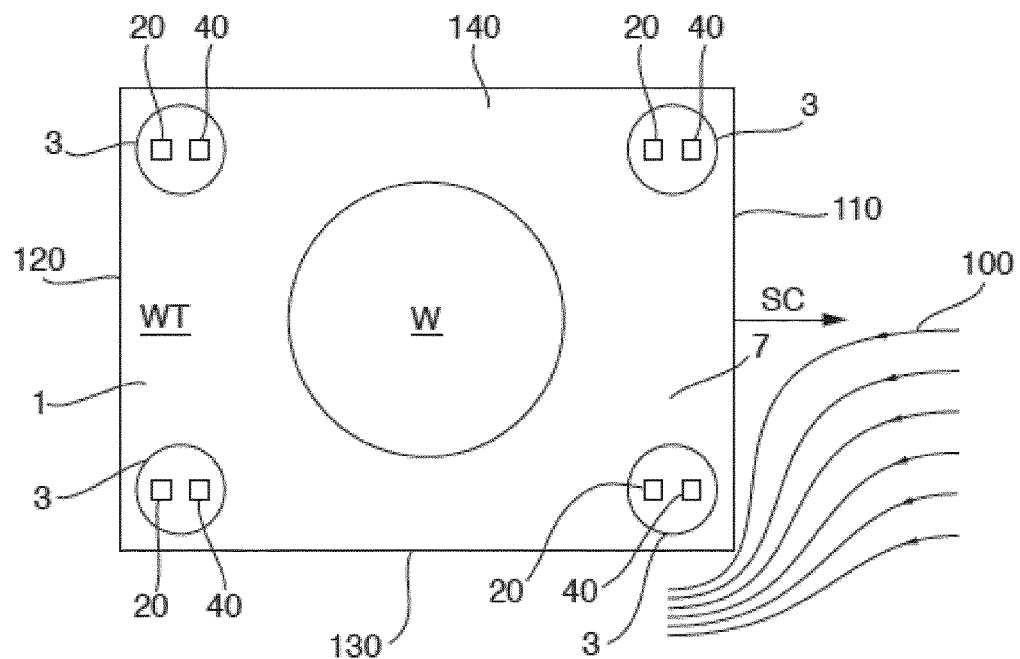
FIG. 2 is a plan view of a substrate table of a lithographic apparatus.
Figure 3:
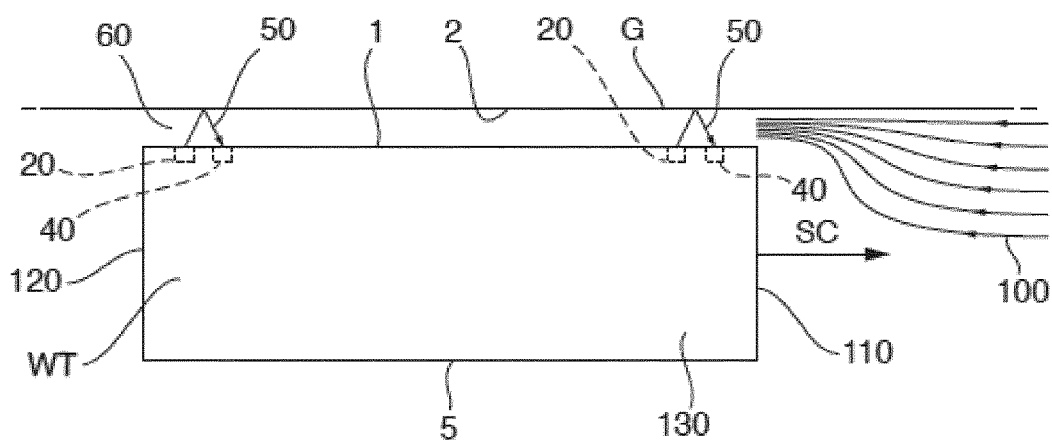
FIG. 3 is a side view of the substrate table of FIG. 2.

FIGS. 2 and 3 illustrate a substrate table WT not in accordance with the present invention. Below the problem addressed by the present invention will be described with reference to FIGS. 2 and 3.

FIG. 2 depicts a schematic plan view of the substrate table WT. The scanning direction SC indicates the relative movement of the substrate table WT with respect to the enclosure EN. FIG. 3 is a schematic side view of the substrate table WT and grid G.

The substrate table WT has a first surface 1 orientated perpendicularly to the optical axis O. The second component has a second surface 2 with the grid G thereon. The first surface 1 orientated perpendicularly to the optical axis O and the second surface 2 face each other. The first surface 1 and second surface 2 may face each other such that they are in parallel planes. Both the first surface 1 and second surface 2 may be horizontal (perpendicular to the optical axis O).

In this embodiment, the first surface 1 accommodates at least one barrier system 3. On the substrate table WT of FIG. 2, four barrier systems 3 can be seen. Other objects may be included on the substrate table WT which have not been shown, for example an object configured to hold a substrate W. Each barrier system 3 is configured to provide a barrier operative to reduce an inflow of ambient gas into a protected volume between the first surface 1 and the second surface 2. Each of the barrier systems 3 shown comprises at least one opening in the first surface 1. The at least one opening in the first surface 1 is adapted for a flow of barrier gas therefrom for establishing a gas curtain enclosing part of the protected volume adjacent the first surface 1.

The embodiment further comprises a radiation source 20 for emitting a measurement radiation beam 50, and a sensor 40 for detecting the measurement radiation beam 50. The measurement radiation beam 50 is projected towards the grid G. The measurement radiation beam 50 is reflected and/or refracted by the grid G back to the sensor 40. The measurement radiation beam 50 passes through the protected volume. The sensor 40 configured to detect the measurement radiation beam 50, is used to indicate the position and/or movement of the grid G relative to the radiation source 20 and/or the sensor 40. The sensor 40 measures displacements of the substrate table WT relative to the grid G. Therefore, the position of the substrate table WT relative to the projection system PS can be determined. This is possible because the position of the grid G relative to the projection system PS is fixed and known.

In this embodiment, the second component comprises a grid G on the second surface 2. The grid G may be directly on the second component. Alternatively, the second component 2 is a grid plate, wherein the surface of the grid G is the second surface 2. The position of the grid G is known relative to other parts, such as the projection system PS, within the lithographic apparatus.

The radiation source 20 and sensor 40 are most conveniently positioned at corners of the substrate table WT. This is due to the center of the substrate table WT being taken up by the substrate W.

In an embodiment the first surface 1 is an upper surface of the substrate table WT. The substrate table WT has a thickness in the direction of the optical axis O. As can be seen from FIG. 3, the thickness of the substrate table WT is very large compared to a gap 60 between the grid G and the substrate table WT. A bottom surface 5 of the substrate table WT is substantially parallel to the first surface 1. This bottom surface 5 can be a bearing surface. During movement of the substrate table WT (for instance in the scanning direction SC), an edge surface of the substrate table WT acts as a front side 110 of the substrate table WT. The front side 110 extends between the first surface 1 and the bottom surface 5. Another edge surface of the substrate table WT acts as a back side 120 of the substrate table WT during the movement in the scanning direction SC. The back side 120 extends between the first surface 1 and the bottom surface 5. The remaining two edge surfaces of the substrate table WT act as side surfaces 130, 140 of the substrate table WT. The side surfaces 130, 140 extend between the first surface 1 and the bottom surface 5. The side surfaces 130, 140 are neither the front nor the back of the substrate table WT during the movement.

The arrows 100 illustrated in FIGS. 2 and 3 are representative of the flow of ambient gas induced during movement of the substrate table WT in the scanning direction SC (to the right in FIGS. 2 and 3) relative to the enclosure EN. As can be seen, the flow of ambient gas 100 is concentrated at corners, in plan, of the substrate table WT (FIG. 2). The flow of ambient gas 100 is also concentrated over the first surface 1 (FIG. 3). The concentration of the flow of ambient gas 100 over the first surface 1 at the corners, in plan, of the substrate table WT is particularly deleterious because this is also the location of the radiation source 20 and sensor 40 for detecting the measurement radiation beam 50.

The present invention addresses the concentration of the flow of ambient gas 100 over the first surface 1. The invention does this by providing a flow direction system configured to direct the flow of ambient gas 100 away from the first surface 1. For a given speed of movement of the substrate table WT, the velocity of the flow of ambient gas 100 over the first surface 1 is reduced compared to the case where no flow direction system is provided. It is expected that break-through of the ambient gas outside the gas barrier 3 into the protected volume only occurs at a higher scanning speed than without the flow direction system. As a result, a higher scanning speed is possible whilst maintaining accuracy of measurements of the position of the substrate table WT relative to the grid G. In an embodiment, the flow direction system is accommodated on the front side 110.

FIGS. 4 and 5 illustrate views of different embodiments of the present invention. As depicted in FIG. 4 and FIG. 5, in an embodiment the first component comprises a measurement sensor 10. In an embodiment the measurement sensor 10 comprises a radiation source 20 and/or a sensor 40, as described above. FIG. 4 and FIG. 5 show details of the barrier system 70 and the barrier 80 provided by the barrier system 70.

The flow of curtain gas that establishes the gas curtain 81 is a turbulent flow. The turbulence causes the gas curtain 81 to entrain gas surrounding the gas curtain 81. The flow of inner entrainment gas 82 is provided to supply gas to be entrained into the gas curtain 81. This reduces the amount of gas in the protected volume 90 from being entrained by the gas curtain 81. This increases the stability of the protected gas in the protected volume 90.

It has been found that the rate of entrainment of gas radially inward of the gas curtain 81 is greater than the volumetric flow rate of the flow of curtain gas itself. In an embodiment the lithographic apparatus is configured such that a volumetric flow rate of the flow of inner entrainment gas 82 is greater than a volumetric flow rate of the flow of curtain gas. By increasing the volumetric flow rate of the flow of inner entrainment gas 82, the amount of protected gas entrained by the gas curtain 81 is reduced. An embodiment of the invention is expected to achieve an increase in stability within the protected volume 90.

If the gas curtain 81 entrains more gas than is provided by the flow of inner entrainment gas 82, then the gas curtain 81 will entrain protected gas from the protected volume 90. This is undesirable. In an embodiment the volumetric flow rate of the flow of inner entrainment gas 82 is sufficiently high that substantially no protected gas from the protected volume 90 is entrained by the gas curtain 81. In an embodiment the lithographic apparatus is configured such that substantially any gas entrained into the flow of curtain gas from radially inward of the flow of curtain gas with respect to the protected volume 90 is gas from the flow of inner entrainment gas 82.

If the flow of inner entrainment gas 82 is too high, then it can not all be entrained by the gas curtain 81. This can result in some of the flow of inner entrainment gas 82 circulating within the protected volume 90. In an embodiment, the flow of inner entrainment gas 82 is sufficiently low that none of it circulates undesirably within the protected volume 90. In an embodiment the lithographic apparatus is configured such that substantially all of the flow of inner entrainment gas 82 is entrained into the flow of curtain gas.

However, this is not necessarily the case. In an embodiment the lithographic apparatus is configured such that a volumetric flow rate of the flow of inner entrainment gas 82 is greater than the maximum volumetric flow rate that can be entrained into the flow of curtain gas from radially inward of the flow of curtain gas with respect to the protected volume 90. This can allow some of the flow of inner entrainment gas 82 to circulate within the protected volume 90. This may be desirable as a way to flush the protected gas in the protected volume 90.

As depicted in FIG. 4, in an embodiment the bather system 70 does not comprise any outer entrainment opening radially outward of the at least one curtain opening 71. In an alternative embodiment shown in FIG. 5, the barrier system 70 comprises at least one outer entrainment opening 73 radially outward of the at least one curtain opening 71.

As depicted in FIG. 5, in an embodiment the bather system 70 comprises at least one outer entrainment opening 73. The at least one outer entrainment opening 73 is adapted for a flow of outer entrainment gas 83 therefrom. The flow of outer entrainment gas 83 is for being entrained into the flow of curtain gas. The lithographic apparatus is configured such that the flow of outer entrainment gas 83 is less turbulent than the flow of curtain gas that establishes the gas curtain 81. In an embodiment the flow of outer entrainment gas 83 is substantially laminar.

The flow of outer entrainment gas 83 is for being entrained by the gas curtain 81. The at least one outer entrainment opening 73 is radially outward of the at least one curtain opening 71 with respect to the protected volume 90.

As depicted in FIG. 5, in an embodiment two laminar supplies are provided, one laminar supply on each side of the gas curtain 81. A computational fluid dynamics model has been used to show that using two laminar supplies can increase stability within the protective volume 90 compared to having a single laminar supply on either the inside or the outside of the gas curtain 81.

In an embodiment the volumetric flow rate of the flow of inner entrainment gas 82 is greater than the volumetric flow rate of the flow of outer entrainment gas 83. It may be desirable to supply a higher volumetric flow rate for the flow of inner entrainment gas 82 so that part of the flow of inner entrainment gas 82 can be used to flush the environment within the protected volume 90. In an embodiment the lithographic apparatus is configured such that the volumetric flow rate of the flow of inner entrainment gas 82 is greater than the maximum volumetric flow rate that can be entrained into the flow of curtain gas from radially inward of the flow of curtain gas.

As described above, the lithographic apparatus can be configured to provide a desired flow balance between the flow of curtain gas and the flow of inner entrainment gas, and/or to provide a desired flow balance between the flow of inner entrainment gas 82 and the flow of outer entrainment gas 83. When the volumetric flow rate of the flow of inner entrainment gas 82 is about twice the volumetric flow rate of the flow of curtain gas, then an equilibrium is reached between the gas curtain 81 and the flow of inner entrainment gas 82. This means that substantially all of the flow of inner entrainment gas 82 is entrained by the gas curtain 81, with substantially no other gas being entrained by the curtain 81 from radially inwards of the gas curtain 81. Similarly, an equilibrium between the flow of outer entrainment gas 83 and the gas curtain 81 is achieved when the volumetric flow rate of the flow of outer entrainment gas 83 is about twice the volumetric flow rate of the flow of curtain gas.

In an embodiment the volumetric flow rates of the flow of inner entrainment gas 82 and the flow of outer entrainment gas 83 is less than the equilibrium values mentioned above. This can help to reduce the overall volumetric flow rate of the barrier system 70. There may be a limited overall flow rate due to the infrastructure of the substrate table WT, for example. In an embodiment, the volumetric flow rate of the flow of inner entrainment gas 82 is about equal to the volumetric flow rate of the flow of curtain gas. In an embodiment the volumetric flow rate of the flow of outer entrainment gas 83 is about equal to the volumetric flow rate of the flow of curtain gas.

Properties of the flow of curtain gas can be affected by physical properties of the at least one curtain opening 71. In an embodiment the at least one curtain opening 71 comprises one continuous slit that forms a continuous shape around the measurement sensor 10. However, this is not necessarily the case. In an embodiment the at least one curtain opening 71 comprises a series of curtain openings 71. For example, each curtain opening 71 may be a slit. In an embodiment each curtain opening 71 comprises a slit having a width in the range of from about 0.05 mm to about 0.2 mm, for example about 0.1 mm. When the at least one curtain opening 71 consists of one continuous slit, the uniformity of the flow of curtain gas may be improved.

The at least one curtain opening 71 can come in different widths. A greater width can result in a reduced velocity of the flow of curtain gas. This can help to reduce the variation in pressure within the protected volume 90. However, if the velocity of the flow of curtain gas is too low, then gas from outside of the protected volume 90 can break through into the protected volume 90.

In an embodiment the at least one inner entrainment opening 72 and/or the at least one outer entrainment opening 73 comprises a series of small holes. For example, a fabric or a sieve may be provided comprises a series of small holes having a diameter within the range of from about 10 µm to about 50 µm, for example about 20 µm. In an embodiment each inner entrainment opening 72 and/or each outer entrainment opening 73 has a total width within the range of from about 3 mm to about 5 mm.

In an embodiment the flow of inner entrainment gas 82 and/or the flow of outer entrainment gas 83 is directed straight upwards from the first surface 1. However, as shown in FIG. 4 and FIG. 5, the flow of inner entrainment gas 82 and the flow of outer entrainment gas 83 is rapidly entrained by the gas curtain 81.

The invention has been described above in relation to an embodiment in which the measurement sensor 10 and bather system 70 are mounted on the substrate table WT and the grid G is stationary relative to the projection system PS. However, the arrangement may be the opposite way round. That is, the measurement sensor 10 and barrier system 70 may be mounted stationary relative to the projection system PS above the substrate table WT. The first surface 1 of the substrate table WT may then have the grid G thereon. The system may otherwise be the same as described above.

In an embodiment, the first component is a measurement table (and not a substrate table WT as described above). The second component is a grid G at a measurement location (and not at an imaging location as described above). Properties of a substrate W mounted on the measurement table such as position on the measurement table, surface topography of the substrate W, etc. are measured at the measurement location. In this embodiment the grid G may be positioned above the measurement table (similar to the main embodiment described above) or may be positioned on the measurement table as described in the preceding paragraph.

In an embodiment the lithographic apparatus is configured such that a magnitude of a flow velocity of the flow of inner entrainment gas 82 is less than a magnitude of a flow velocity of the flow of curtain gas.

In an embodiment the first surface 1 accommodates a radiation source 20 for projecting a radiation beam along a beam path within the protected volume, wherein the inner entrainment opening 72 surrounds the radiation source 20.

In an embodiment the lithographic apparatus is configured such that a magnitude of a flow velocity of the flow of outer entrainment gas 83 is less than a magnitude of a flow velocity of the flow of curtain gas.

In an embodiment the lithographic apparatus is configured such that a volumetric flow rate of the flow of outer entrainment gas 83 is greater than a volumetric flow rate of the flow of curtain gas.

In an embodiment the lithographic apparatus is configured such that substantially all of the flow of outer entrainment gas 83 is entrained into the flow of curtain gas.

In an embodiment the lithographic apparatus is configured such that substantially all of the gas entrained into the flow of curtain gas from radially outward of the flow of curtain gas is entrained from the flow of outer entrainment gas 83.

A lithographic apparatus in accordance with at least one of the above embodiments can be used in a device manufacturing method to irradiate a substrate using a projection radiation beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising a first component and a second component that are configured to undergo relative movement with respect to one another, wherein:
   the first component has a first surface;
   the second component has a second surface, the first surface and the second surface facing each other in a use;
   the first surface accommodates a barrier system configured to provide a barrier operative to reduce or prevent an inflow of ambient gas into a protected volume of gas between the first surface and the second surface, the barrier system comprising:
   at least one curtain opening configured to provide a flow of curtain gas therefrom to establish a gas curtain enclosing part of the protected volume adjacent the first surface; and
   at least one inner entrainment opening configured to provide a flow of inner entrainment gas therefrom for being entrained into the flow of curtain gas;
   wherein the lithographic apparatus is configured such that the flow of inner entrainment gas is less turbulent than the flow of curtain gas; and
   the at least one inner entrainment opening is radially inward of the at least one curtain opening with respect to the protected volume.

2. The lithographic apparatus of claim 1, configured such that a volumetric flow rate of the flow of inner entrainment gas is greater than a volumetric flow rate of the flow of curtain gas.

3. The lithographic apparatus of claim 1, configured such that substantially any gas entrained into the flow of curtain gas from radially inward of the flow of curtain gas with respect to the protected volume is gas from the flow of inner entrainment gas.

4. The lithographic apparatus of claim 1, configured such that a volumetric flow rate of the flow of inner entrainment gas is greater than a maximum volumetric flow rate that can be entrained into the flow of curtain gas from radially inward of the flow of curtain gas with respect to the protected volume.

5. The lithographic apparatus of claim 1, configured such that substantially all of the flow of inner entrainment gas is entrained into the flow of curtain gas.

6. The lithographic apparatus of claim 1, wherein the barrier system comprises at least one outer entrainment opening configured to provide a flow of outer entrainment gas therefrom for being entrained into the flow of curtain gas, wherein the lithographic apparatus is configured such that the flow of outer entrainment gas is less turbulent than the flow of curtain gas and wherein the at least one outer entrainment opening is radially outward of the at least one curtain opening with respect to the protected volume.

7. The lithographic apparatus claim 6, configured such that a volumetric flow rate of the flow of inner entrainment gas is greater than a volumetric flow rate of the flow of outer entrainment gas.

8. A method in a lithographic process, the method comprising:
   performing relative movement between of a first component and second component, wherein the first component has a first surface, the second component has a second surface and the first surface and the second surface face each other; and
   providing a barrier operative to reduce or prevent an inflow of ambient gas into a protected volume of gas between the first surface and the second surface, wherein providing the barrier comprises:
   providing a flow of curtain gas from at least one curtain opening accommodated by the first surface so as to establish a gas curtain enclosing part of the protected volume adjacent the first surface; and
   providing a flow of inner entrainment gas from at least one inner entrainment opening accommodated by the first surface for being entrained into the flow of curtain gas,
   wherein the flow of inner entrainment gas is less turbulent than the flow of curtain gas, and
   wherein the at least one inner entrainment opening is radially inward of the at least one curtain opening with respect to the protected volume.

9. The method of claim 8, wherein a volumetric flow rate of the flow of inner entrainment gas is greater than a volumetric flow rate of the flow of curtain gas.

10. The method of claim 8, wherein substantially any gas entrained into the flow of curtain gas from radially inward of the flow of curtain gas with respect to the protected volume is gas from the flow of inner entrainment gas.

11. The method of claim 8, wherein a volumetric flow rate of the flow of inner entrainment gas is greater than a maximum volumetric flow rate that can be entrained into the flow of curtain gas from radially inward of the flow of curtain gas with respect to the protected volume.

12. The method of claim 8, wherein substantially all of the flow of inner entrainment gas is entrained into the flow of curtain gas.

13. The method of claim 8, further comprising providing a flow of outer entrainment gas, from at least one outer entrainment opening, for being entrained into the flow of curtain gas, wherein the flow of outer entrainment gas is less turbulent than the flow of curtain gas and the at least one outer entrainment opening is radially outward of the at least one curtain opening with respect to the protected volume.

14. The method of claim 13, wherein a volumetric flow rate of the flow of inner entrainment gas is greater than a volumetric flow rate of the flow of outer entrainment gas.

15. An apparatus comprising:
 a first component having a first surface; and
 a second component having a second surface, wherein, in a use; the first surface faces the second surface and wherein a relative movement can be provided between the first and second components;
 a gas curtain opening, located at the first surface, configured to provide a flow of curtain gas to establish a gas curtain configured to enclose part of a protected volume of gas between the first and second surfaces and to reduce or prevent an inflow of ambient gas into the protected volume of gas; and
 an inner entrainment opening, located inward of the gas curtain opening relative to the protected volume, configured to provide a flow of inner entrainment gas for being entrained into the flow of curtain gas,
 wherein the apparatus is configured such that the flow of inner entrainment gas is less turbulent than the flow of curtain gas.

16. The apparatus of claim 15, configured such that a volumetric flow rate of the flow of inner entrainment gas is greater than a volumetric flow rate of the flow of curtain gas.

17. The apparatus of claim 15, configured such that substantially any gas entrained into the flow of curtain gas from inward, relative to the protected volume, of the flow of curtain gas is gas from the flow of inner entrainment gas.

18. The apparatus of claim 15, configured such that a volumetric flow rate of the flow of inner entrainment gas is greater than a maximum volumetric flow rate that can be entrained into the flow of curtain gas from inward, relative to the protected volume, of the flow of curtain gas.

19. The apparatus of claim 15, further comprising an outer entrainment opening, located outward of the curtain opening relative to the protected volume, configured to provide a flow of outer entrainment gas for being entrained into the flow of curtain gas, wherein the apparatus is configured such that the flow of outer entrainment gas is less turbulent than the flow of curtain gas.

20. The apparatus claim 19, configured such that a volumetric flow rate of the flow of inner entrainment gas is greater than a volumetric flow rate of the flow of outer entrainment gas.

* * * * *